United States Patent
Chang et al.

(10) Patent No.: US 9,941,239 B2
(45) Date of Patent: *Apr. 10, 2018

(54) ELECTROSTATIC DISCHARGE PROTECTION APPARATUS AND PROCESS

(71) Applicant: Taiwan Semiconductor Manufacturing Company, Ltd., Hsin-Chu (TW)

(72) Inventors: Wen-Chien Chang, Hsinchu (TW); Hsiang-Tai Lu, Zhubei (TW); Dai-Jang Chen, New Taipei (TW); Chih-Hsien Lin, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

This patent is subject to a terminal disclaimer.

(21) Appl. No.: 15/345,134

(22) Filed: Nov. 7, 2016

(65) Prior Publication Data

US 2017/0053890 A1   Feb. 23, 2017

Related U.S. Application Data

(63) Continuation of application No. 14/026,060, filed on Sep. 13, 2013, now Pat. No. 9,491,840.

(51) Int. Cl.
*H01L 21/00* (2006.01)
*H01L 23/00* (2006.01)
(Continued)

(52) U.S. Cl.
CPC ........ *H01L 24/75* (2013.01); *H01L 21/67207* (2013.01); *H01L 23/49827* (2013.01); *H01L 23/60* (2013.01); *H01L 24/03* (2013.01); *H01L 24/04* (2013.01); *H01L 24/81* (2013.01); *H01L 25/0657* (2013.01); *H01L 25/50* (2013.01); *H05F 3/02* (2013.01); *H01L 24/11* (2013.01); *H01L 2224/038* (2013.01); *H01L 2224/0346* (2013.01); *H01L 2224/0361* (2013.01); *H01L 2224/0362* (2013.01); *H01L 2224/03912* (2013.01); *H01L 2224/0401* (2013.01); *H01L 2224/05009* (2013.01); *H01L 2224/05022* (2013.01); *H01L 2224/0558* (2013.01); *H01L 2224/05124* (2013.01); *H01L 2224/05147* (2013.01); *H01L 2224/05572* (2013.01); *H01L 2224/05655* (2013.01); *H01L 2224/05666* (2013.01); *H01L 2224/1146* (2013.01); *H01L 2224/11849* (2013.01); *H01L 2224/13005* (2013.01); *H01L 2224/13022* (2013.01); *H01L 2224/13111* (2013.01); *H01L 2224/13113* (2013.01); *H01L 2224/13116* (2013.01);
(Continued)

(58) Field of Classification Search
CPC .......................................................... H05F 3/02
USPC .......................................................... 438/125
See application file for complete search history.

(56) References Cited

U.S. PATENT DOCUMENTS 5,418,186 A   5/1995   Park et al.
6,400,169 B1   6/2002   Hembree et al.
(Continued)

*Primary Examiner* — Ajay K Arora
(74) *Attorney, Agent, or Firm* — Haynes and Boone, LLP

(57) ABSTRACT

In a process, at least one circuit element is formed in a substrate. A conductive layer is formed over the substrate and in electrical contact with the at least one circuit element. Electrostatic charges are discharged from the substrate via the conductive layer.

20 Claims, 5 Drawing Sheets

(51) Int. Cl.
*H05F 3/02* (2006.01)
*H01L 21/67* (2006.01)
*H01L 23/60* (2006.01)
*H01L 25/00* (2006.01)
*H01L 23/498* (2006.01)
*H01L 25/065* (2006.01)

(52) U.S. Cl.
CPC .............. *H01L 2224/13139* (2013.01); *H01L 2224/13144* (2013.01); *H01L 2224/13147* (2013.01); *H01L 2224/13155* (2013.01); *H01L 2224/752* (2013.01); *H01L 2224/75101* (2013.01); *H01L 2224/81009* (2013.01); *H01L 2225/06513* (2013.01); *H01L 2225/06541* (2013.01); *H01L 2924/1305* (2013.01); *H01L 2924/13091* (2013.01); *H01L 2924/15787* (2013.01); *H01L 2924/15788* (2013.01); *H01L 2924/30205* (2013.01); *Y10T 29/52* (2015.01)

(56) References Cited

U.S. PATENT DOCUMENTS

| | | |
|---|---|---|
| 6,621,673 B2 | 9/2003 | Lin et al. |
| 7,576,414 B2 | 8/2009 | Huang et al. |
| 8,198,736 B2 | 6/2012 | Henderson et al. |
| 8,689,437 B2 | 4/2014 | Dang et al. |
| 8,773,837 B2 | 7/2014 | Partridge et al. |
| 2010/0258949 A1* | 10/2010 | Henderson ........ H01L 21/67092 257/777 |

* cited by examiner

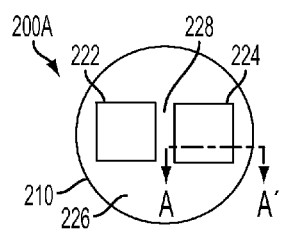
FIG. 2A(1)
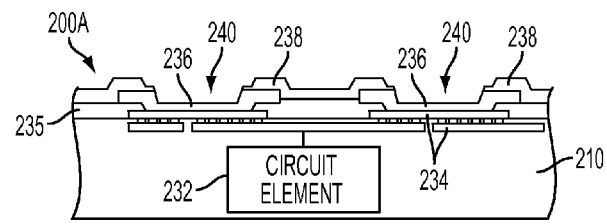
FIG. 2A(2)
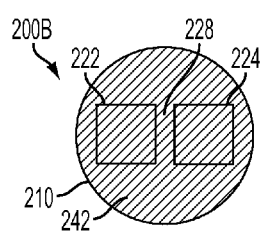
FIG. 2B(1)
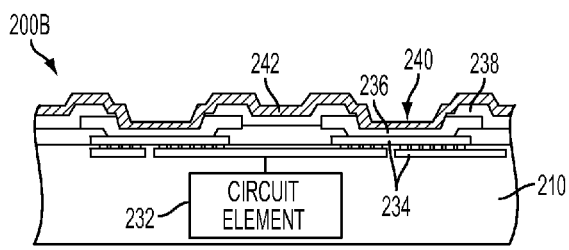
FIG. 2B(2)
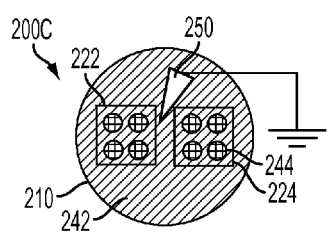
FIG. 2C(1)
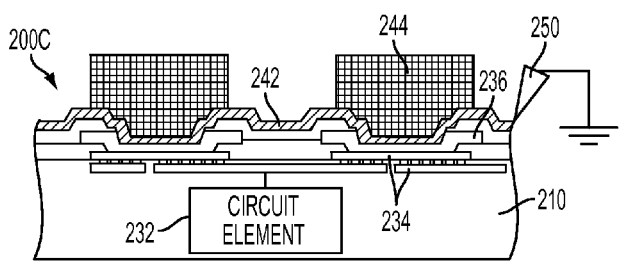
FIG. 2C(2)
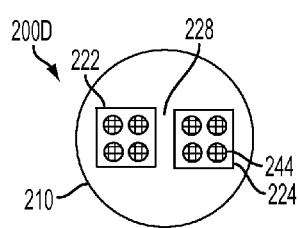
FIG. 2D(1)
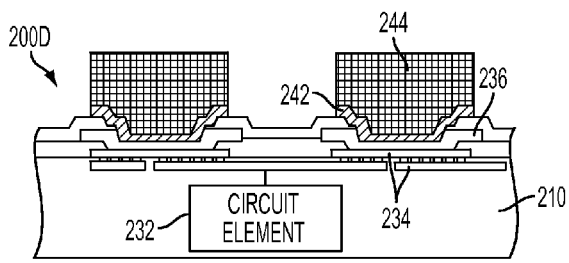
FIG. 2D(2)

ELECTROSTATIC DISCHARGE PROTECTION APPARATUS AND PROCESS

PRIORITY DATA

The present application is a continuation application of U.S. patent application Ser. No. 14/026,060, filed Sep. 13, 2013, entitled "ELECTROSTATIC DISCHARGE PROTECTION APPARATUS AND PROCESS" issuing as U.S. Pat. No. 9,491,840, of which is hereby incorporated by reference in its entirety.

BACKGROUND

The recent trend in miniaturizing integrated circuits (ICs) has resulted in smaller devices which consume less power, yet provide more functionally at higher speeds than before. The miniaturization process has also increased device susceptibility to electrostatic discharge (ESD) events due to various factors, such as thinner dielectric thicknesses and associated lowered dielectric breakdown voltages. ESD is one of the primary causes of electronic circuit damage and is also one of the primary considerations in semiconductor advanced technology. ESD is a consideration not only during operation, but also during manufacture of semiconductor devices.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A(1), 2B(1), 2C(1) and 2D(1) are schematic top views and FIGS. 2A(2), 2B(2), 2C(2) and 2D(2) are corresponding schematic, cross-sectional views of a semiconductor structure during various stages of a process in accordance with some embodiments.

DETAILED DESCRIPTION

Figure 1:
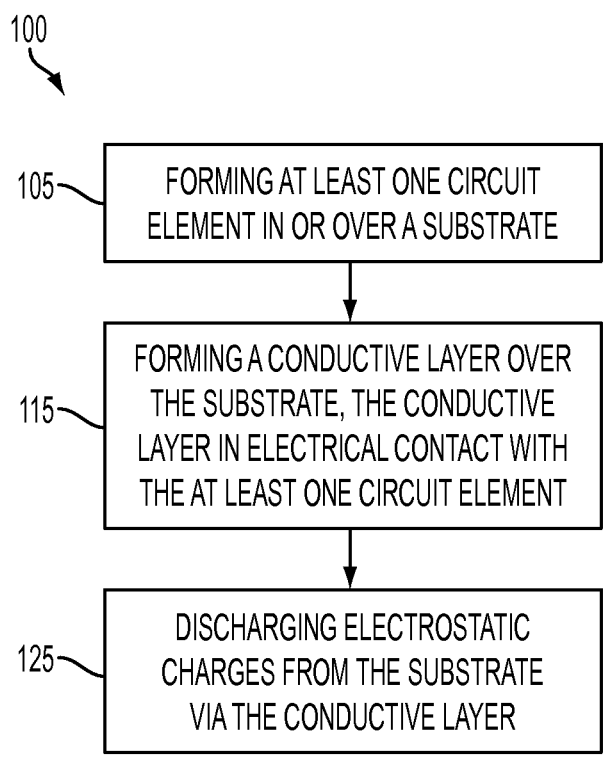
FIG. 1 is a flow chart of a process in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details. Like reference numerals in the drawings denote like elements.

In some embodiments, a conductive layer is formed over a wafer, and is in electrical contact with one or more circuit elements previously formed in the wafer. Electrostatic charges are discharged from the wafer via the conductive layer. For example, electrostatic charges are discharged by temporarily grounding the conductive layer. In one or more embodiments, the conductive layer includes an intended conductive feature for a semiconductor device to be manufactured. For example, the conductive layer includes a layer of an under-bump metal (UBM) structure of the semiconductor device. As a result, it is possible to effectively provide ESD protection simply by adding a discharging operation to the manufacturing process. Compared to other approaches, which use an ionizer for neutralizing electrostatic charges accumulated in wafers, the discharging operation in accordance with some embodiments provides a simpler, cheaper and more reliable approach for ESD protection.

FIG. 1 is a flow chart of a process 100 in accordance with some embodiments. FIGS. 2A(1), 2B(1), 2C(1) and 2D(1) are schematic top views and FIGS. 2A(2), 2B(2), 2C(2) and 2D(2) are corresponding schematic, cross-sectional views of a semiconductor structure during various stages of a process in accordance with some embodiments. The following description will be given with reference to FIG. 1, FIGS. 2A(1), 2B(1), 2C(1) and 2D(1), and corresponding FIGS. 2A(2), 2B(2), 2C(2) and 2D(2).

As illustrated in FIG. 1, at operation 105 in the process 100, at least one circuit element is formed in a substrate. For example, as illustrated in FIG. 2A(1), which is a top view of a semiconductor structure 200A, a substrate 210 includes a plurality of dies 222, 224 formed therein. The substrate 210 further includes a region 226 outside the plurality of dies 222, 224. The region 226 includes at least one scribe line 228 along which the substrate 210 is to be cut in a singulation operation to individually separate the plurality of dies 222, 224 from each other. FIG. 2A(2) is a partial, cross-sectional view of the die 224 taken along line A-A' in FIG. 2A(1). As illustrated in FIG. 2A(1), the die 224 includes at least one circuit element 232 formed in the substrate 210.

The substrate 210 includes a semiconductor substrate or an insulating substrate. Examples of a semiconductor substrate include, but are not limited to, bulk silicon, a semiconductor wafer, a silicon-on-insulator (SOI) substrate, or a silicon germanium substrate. Other semiconductor materials including group III, group IV, and group V elements are used in various embodiments. Example materials of an insulating substrate include, but are not limited to, bismaleimide triazine (BT) resin, epoxy mixed with glass fibers, ceramic, glass, plastic, tape, film, or other supporting materials.

The circuit element 232 includes an active circuit element or a passive circuit element. Examples of active circuit elements include, but are not limited to, transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), and diodes. Examples of passive circuit elements include, but are not limited to, capacitors, inductors, fuses, resistors, and interconnects. Examples of interconnects include, but are not limited to, vias, conductive pads, conductive patterns, and conductive redistribution layers.

In some embodiments, at least one of the plurality of dies 222, 224 includes an integrated circuit (or chip) defined by a plurality of interconnected active circuit elements formed in a semiconductor substrate 210 which further includes isolation features, such as shallow trench isolation (STI) features or local oxidation of silicon (LOCOS) features. In some embodiments, at least one of the plurality of dies 222, 224 includes an interposer formed in semiconductor substrate or an insulating substrate 210 which further includes through substrate vias (TSVs). In at least one embodiment, the interposer includes one or more active circuit elements and is referred to as an active interposer. In at least one embodiment, the interposer does not include active circuit elements and is referred to as a passive interposer.

As illustrated in FIG. 2A(1), one or more metal layers 234 are formed over and in electrical contact with the circuit element 232. The metal layers 234 are patterned and connected with each other by vias to provide intended conductive connections for the semiconductor device being manufactured. Example materials of the metal layers 234 include, but are not limited to, copper or copper alloys, or of other metals. The metal layers 234 are configured to provide external electrical connections for the circuit element 232 and to protect the underlying layers from various environmental contaminants. One or more inter-metal dielectric (IMD) layers are interposed between the metal layers 234. Example materials of the IMD layer include, but are not limited to, silicon nitride, silicon oxide, undoped silicon glass, and the like. In at least one embodiment, a contact pad is formed over the top metal layer among the metal layers 234, or alternatively, is electrically coupled to the top metal layer through a via. Example materials of the contact pad include, but are not limited to, aluminum, aluminum copper, aluminum alloys, copper, and copper alloys.

A passivation layer 235 is formed over the contact pad. Example materials of the passivation layer 235 include, but are not limited to, undoped silicate glass (USG), silicon nitride, silicon oxide, silicon oxynitride or a non-porous material. In at least one embodiment, the passivation layer 235 is formed by chemical vapor deposition (CVD) or physical vapor deposition (PVD). The passivation layer 235 is patterned to cover the peripheral portion of the contact pad, and to expose the central portion of the contact pad through an opening in the passivation layer 235. In at least one embodiment, a protective layer is formed over the passivation layer 235. Example materials of the protective layer include, but are not limited to, polymers, which, in some embodiments, include an epoxy, polyimide, benzocyclobutene (BCB), polybenzoxazole (PBO), and other relatively soft, organic, dielectric materials. In at least one embodiment, the protective layer is formed by spin coating or other methods.

An interconnect layer 236 is formed over the protective layer and is in electrical contact with the exposed central portion of the contact pad. In at least one embodiment, the interconnect layer 236 is a post-passivation interconnect (PPI) layer, which also functions as power lines, re-distribution lines (RDL), inductors, capacitors or passive circuit elements. Example materials of the interconnect layer 236 include, but are not limited to, copper, aluminum, copper alloy, or other mobile conductive materials. In at least one embodiment, the interconnect layer 236 is formed by plating, electroless plating, sputtering, or chemical vapor deposition, and patterned to provide intended electrical connections for the semiconductor device being manufactured.

A protective layer 238 is formed over the interconnect layer 236. Using photolithography and/or etching processes, the protective layer 238 is patterned to form one or more openings 240 exposing at least a portion of the interconnect layer 236. Example materials of the protective layer 238 include, but are not limited to, polymers, which, in some embodiments, include an epoxy, polyimide, benzocyclobutene (BCB), polybenzoxazole (PBO), and other relatively soft, organic, dielectric materials. In some embodiments, the protective layer 238 is formed of a non-organic material such as un-doped silicate glass (USG), silicon nitride, silicon oxynitride, silicon oxide, and combinations thereof. In at least one embodiment, the protective layer is formed by spin coating or other methods.

As illustrated in FIG. 1, at operation 115 in the process 100, a conductive layer is formed over the substrate, and the conductive layer is in electrical contact with the at least one circuit element. For example, as illustrated in FIG. 2B(1), which is a top view of a semiconductor structure 200B, a conductive layer 242 is formed over the substrate 210. The conductive layer 242 covers the plurality of dies 222, 224 and the region 226 outside the plurality of dies 222, 224, including the scribe line 228. FIG. 2B(2) is a view similar to FIG. 2A(2), and shows a partial, cross-sectional view of the die 224. As illustrated in FIG. 2A(1), the conductive layer 242 is formed over the substrate 210, along the bottom and sidewalls of the openings 240 in the protective layer 238, and in electrical contact with the circuit element 232 via the metal layers 234, and the interconnect layer 236.

In at least one embodiment, the conductive layer 242 is a layer of a UBM structure. In at least one embodiment, the conductive layer 242 includes one or more layers of titanium, titanium, titanium copper, nickel or alloys thereof. Other conductive materials or combinations of different layers of conductive material are within the scope of various embodiments. In at least one embodiment, the conductive layer 242 is a seed metal layer configured to promote growth of other metal layers in the UBM structure. In at least one embodiment, the conductive layer 242 is formed by sequentially forming one or more metal layers over the protective layer 238 and in the opening 240 of the protective layer 238, using a plating process, such as electrochemical plating, although other processes of formation, such as sputtering, evaporation, or plasma-enhanced CVD (PECVD process are within the scope of various embodiments.

As illustrated in FIG. 1, at operation 125 in the process 100, electrostatic charges are discharged from the substrate via the conductive layer. For example, as illustrated in FIG. 2C(1), which is a top view of a semiconductor structure 200C, a grounded electrode 250 is caused to temporarily contact the conductive layer 242. As a result, electrostatic charge accumulated in the substrate 210 is discharged via the circuit element 232, the conductive layer 242, and the grounded electrode 250 to the ground, as best seen in FIG. 2C(2), which is a view similar to FIG. 2A(2) and shows a partial, cross-sectional view of the die 224. Because the electrode 250 is grounded, both positive and negative electrostatic charges are discharged in the same discharging operation. In at least one embodiment, the grounded electrode 250 is maintained in contact with the conductive layer 242 for a few seconds to ensure complete, or at least substantially complete, discharge of the electrostatic charges accumulated in the substrate 210. In one or more embodiments, the grounded electrode 250 is caused to contact the region 226 outside the plurality of dies 222, 224 to avoid causing damage to the plurality of dies 222, 224. For example, the grounded electrode 250 is caused to contact the conductive layer 242 over the scribe line 228. In at least one embodiment, the grounded electrode 250 is caused to contact the conductive layer 242 in the region 226, but not over the scribe line 228. For example, the grounded electrode 250 is caused to contact the conductive layer 242 along a peripheral region of the substrate 210.

As illustrated FIGS. 2C(1) and 2C(2), one or more conductive bumps 244 are formed over the conductive layer 242. In at least one embodiment, the conductive bumps 244 are formed before the discharging operation. A reason is that the formation of the conductive bumps 244, which involves electrostatic charge inducing operations such as plasma and/or scrub-clean operations, potentially causes electrostatic charges to be accumulated in the substrate 210. By forming the conductive bumps 244 before the discharging operation, electrostatic charges accumulated in the substrate 210 during the formation of the conductive bumps 244 are also discharged, thereby providing reliable ESD protection. However, forming the conductive bumps 244 after the discharging operation is within the scope of various embodiments.

In some embodiments, the conductive bumps 244 include a solder bump, a Cu bump or a metal bump including Ni or Au. For example, the conductive bumps 244 are formed by attaching solder balls on the conductive layer 242 in the openings 240, and then thermally reflowing the material. Example solder materials include, but are not limited to, lead-free pre-solder materials, SnAg, Cu, and solder materials including alloys of two or more of tin, lead, silver, copper, nickel, and bismuth. In some embodiments, the conductive bumps 244 are formed by plating a solder layer with photolithography technologies followed by a reflowing operation. In some embodiments, the conductive bumps 240 have a diameter of about 200 micrometers (μm) to about 300 μm. In other embodiments, the conductive bumps 240 have a diameter of about 100 μm to about 200 μm. In still other embodiments, the conductive bumps 240 have a diameter of less than about 100 μm.

In some embodiments, after the discharging operation using the conductive layer 242, the conductive layer 242 is partially removed as illustrated in FIG. 2D(1), which is a top view of a semiconductor structure 200D, and FIG. 2D(2), which is a view similar to FIG. 2A(2) and shows a partial, cross-sectional view of the die 224. For example, the conductive layer 242 is partially removed in at least one embodiment through photolithographic masking and etching operations to remove the undesired portions of the conductive layer 242 and to leave the conductive layer 242 in a desired shape, such as a circular, octagonal, square, or rectangular shape, although other shapes are within the scope of various embodiments. In at least one embodiment, a photolithographic masking operation is omitted, and the conductive layer 242 is partially removed e.g., etched, by using the conductive bumps 244 as etch masks. In the resulting structure 200D illustrated in FIG. 2D(2), the conductive layer 242 is removed from the substrate 210 except for portions immediately underlying the conductive bumps 244. The conductive bumps 244, the conductive layer 242, the interconnect layer 236, the metal layers 234 and conductive connections therebetween define a connecting structure for the semiconductor device being manufactured over the substrate 210. After forming the conductive bumps 244, one or more further operations are performed. For example, an encapsulant is formed over the substrate 210 while leaving the conductive bumps 244 exposed, and/or a singulation operations is performed to singulate the plurality of dies 222, 224, and/or a wafer-level or die-level stacking is performed to obtain a three-dimensional IC (3DIC) structure.

Although in the above description, the conductive layer by which electrostatic charges are discharged from the substrate is a layer of an UBM structure, the present disclosure is not so limited. In some embodiments, it is possible to use any conductive layer formed over the substrate for discharging electrostatic charges from the substrate. For example, any one or more of the metal layers 234 and interconnect layer 236 is/are usable for discharging electrostatic charges from the substrate. However, because a layer of a UBM structure, such as the conductive layer 242, is formed later than the metal layers 234 and interconnect layer 236, a discharging operation using the conductive layer 242 also removes electrostatic charges accumulated after the formation of the metal layers 234 and interconnect layer 236, thereby providing more complete ESD protection than when one or more of the metal layers 234 and interconnect layer 236 is/are used for discharging electrostatic charges. In at least one embodiment, multiple discharging operations are performed, using different conductive layers, e.g., a first discharging operation using the interconnect layer 236 and a second discharging operation using the conductive layer 242.

Compared to other approaches which use ionizers for neutralizing electrostatic charges accumulated in wafers, the discharging operation in accordance with some embodiments provides a cheaper approach for ESD protection, because equipment and operation costs associated with ionizers are avoidable. The other approaches using ionizers are more complex because both negative and positive ions are generated to neutralize positive and negative electrostatic charges, respectively, on wafers. To the contrary, the discharging operation in accordance with some embodiments permits both positive and negative electrostatic charges to be discharged simply by a grounded electrode and the conductive layer in contact therewith. In addition, effectiveness of ESD protection using ionizers depends on cleanliness of the ionizing electrode which is affected by corona and associated byproducts, such as ozone and nitride oxide. Constant maintenance of the ionizing electrode is therefore a concern in the other approaches using ionizers. However, in the discharging operation in accordance with some embodiments, byproducts potentially polluting the electrode are unlikely to be generated, thereby reducing the maintenance cost compared to the other approaches. Another potential issue observed in the other approaches is reliability, because it is possible that an ionizer leaves positive or negative charges on the wafer due to insufficient quantity of corresponding negative or positive ions. To address this potential issue, fine-tuning of ionizer recipes for different products is considered, which adds time and cost to the other approaches. The discharging operation in accordance with some embodiments achieves ESD protection reliability simply by ensuring a good ground path from the wafer, via the conductive layer and the grounded electrode to the ground.

In at least one embodiment, a conductive layer is formed over the entirety, or at least a significant portion, of a wafer, and is in contact with all, or at least most, circuit elements previously formed in the wafer. As a result, it is possible to effectively discharge electrostatic charges from the entirety, or at least a significant portion, of the wafer. Circuit elements that belong to different dies or chips are discharged in a single discharging operation, thereby increasing efficiency. In at least one embodiment, by causing the grounded electrode to contact the conductive layer in the region outside the dies, e.g., over a scribe line, damage to the dies are avoidable.

The discharging operation in accordance with some embodiments is particularly useful for interposers and/or 3DIC structures. Interposers generally include a lower content of metals and conductive materials, and a higher content of dielectric materials, than chips. As a result, it is potentially more difficult for electrostatic charges to be discharged from interposers and/or 3DIC structures which include, or have similar characteristics to, interposers. Electrostatic charges accumulated in interposers and/or 3DIC structures are likely to discharge to adjacent chips during manufacture, and potentially cause damage in such chips. By providing a well-defined ground path, in the form of a grounded electrode in electrical contact with a conductive layer, for electrostatic charges to be discharged from interposers and/or 3DIC structures, uncontrolled electrostatic discharge to, and potential damage of, adjacent chips are avoidable.

Figure 3:
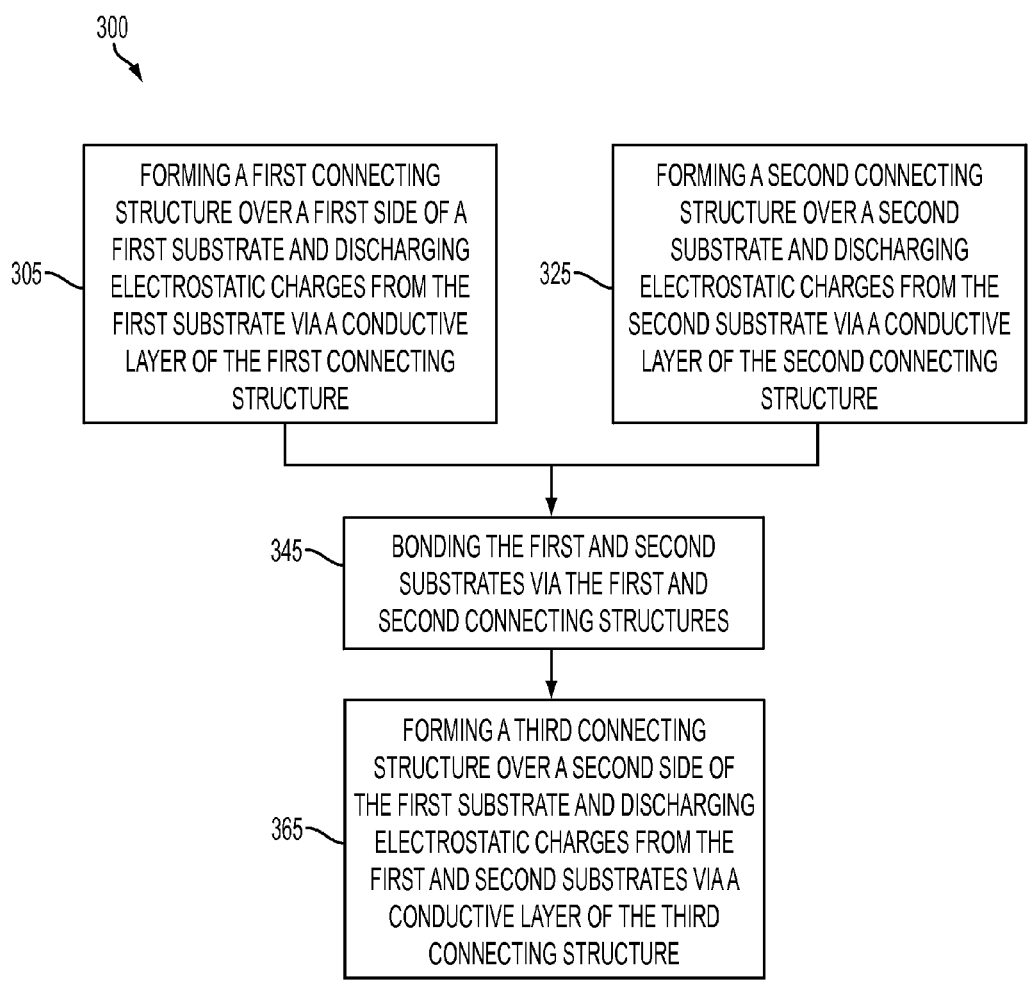
FIG. 3 is a flow chart of a process in accordance with some embodiments.

FIG. 3 is a flow chart of a process 300 in accordance with some embodiments. FIGS. 4A-4G are schematic, cross-sectional views of a semiconductor structure during various stages of a process in accordance with some embodiments. The following description will be given with reference to FIG. 3 and FIGS. 4A-4G.

Figure 4A:
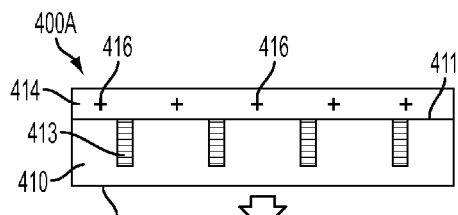
FIGS. 4A-4G are schematic, cross-sectional views of a semiconductor structure during various stages of a process in accordance with some embodiments.
Figure 4C:
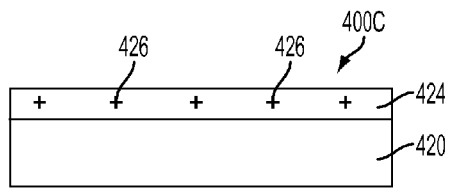
Figure 4B:
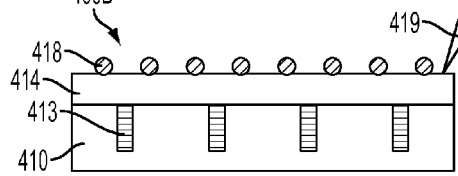

As illustrated in FIG. 3, at operation 305 in the process 300, a first connecting structure is formed over a first side of a first substrate, and electrostatic charges are discharged from the first substrate via a conductive layer of the first connecting structure. For example, as illustrated in FIGS. 4A-4B, a first substrate 410 has a first side 411 and a second side 412. The first substrate 410 is an interposer and has one or more TSVs 413 formed therein. The TSVs 413 extend over a thickness of the first substrate 410, from the first side 411 toward the second side 412.

A first connecting structure is formed over the first side 411 of the first substrate 410. In at least one embodiment, the first connecting structure corresponds to the connecting structure described with respect to FIGS. 2A(1), 2B(1), 2C(1) and 2D(1), and corresponding FIGS. 2A(2), 2B(2), 2C(2) and 2D(2). For example, the first connecting structure includes one or more conductive layers corresponding to the metal layers 234, interconnect layer 236 and conductive layer 242. For simplicity, a conductive layer 414, which is a layer of an UBM structure and corresponds to the conductive layer 242, is illustrated in FIG. 4A. The first connecting structure further includes one or more conductive bumps 418 corresponding to the conductive bumps 244, as illustrated in FIG. 4B. In at least one embodiment, the conductive bumps 418 include uBumps (micro bumps).

In at least one embodiment, the formation of the first connecting structure includes a scrub-cleaning operation to clean the first substrate 410, and then a sputtering operation is performed to form the conductive layer 414 over the first side 411 of the first substrate 410. A resulting structure 400A is obtained as illustrated in FIG. 4A. The formation of the conductive layer 414 and/or the previously formed components, e.g., TSVs 413, in the first substrate 410 causes electrostatic charges 416 to accumulate in the first substrate 410 at the conductive layer 414 and/or the TSVs 413.

The formation of the first connecting structure further includes a photolithography operation to deposit a patterned photoresist layer over the conductive layer 414 to expose portions of the conductive layer 414 intended for receiving the conductive bumps 418, while covering other portions. A plating operation is subsequently performed to form the conductive bumps 418 over the exposed portions of the conductive layer 414. The photoresist is then removed. The formation of the conductive bumps 418 causes electrostatic charges to further accumulate in the first substrate 410.

After the formation of the conductive bumps 418 and before patterning the conductive layer 414, a grounded electrode 419 is temporarily brought into contact with the conductive layer 414, as illustrated in FIG. 4B and described with respect to FIGS. 2C(1)-2C(2), thereby discharging electrostatic charges 416 from the first substrate 410. The conductive layer 414 is subsequently partially etched as described with respect to FIGS. 2D(1), 2D(2). A resulting structure 400B is obtained as illustrated in FIG. 4B. In one or more embodiments, the discharging operation for the first substrate 410 is omitted.

Figure 4D:
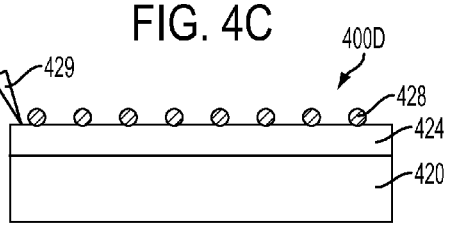

As illustrated in FIG. 3, at operation 325 in the process 300, a second connecting structure is formed over a second substrate, and electrostatic charges are discharged from the second substrate via a conductive layer of the second connecting structure. For example, as illustrated in FIGS. 4C-4D, a second substrate 420 includes an IC (not shown) therein. A second connecting structure is formed over the first substrate 410. The second connecting structure includes a conductive layer 424 corresponding to the conductive layers 414, as illustrated in FIG. 4C, and one or more conductive bumps 428 corresponding to the conductive bumps 418, as illustrated in FIG. 4D.

In at least one embodiment, the formation of the second connecting structure and the discharging operation for the second substrate 420 are similar to the formation of the first connecting structure and the discharging operation for the first substrate 410. For example, a grounded electrode 429 is temporarily brought into contact with the conductive layer 424, as illustrated in FIG. 4D, to discharge electrostatic charges 426 from the second substrate 420 before the conductive layer 424 is partially removed. A resulting structure 400D is obtained as illustrated in FIG. 4D. In one or more embodiments, the discharging operation for the second substrate 420 is omitted. The operations described with respect to FIGS. 4A-4D are referred to as the front-side process.

Figure 4E:
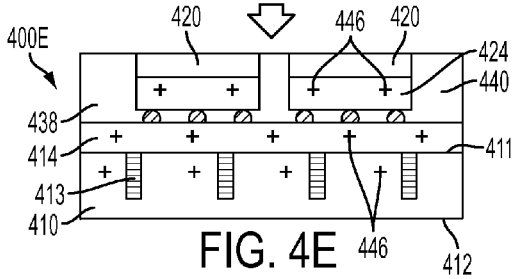

As illustrated in FIG. 3, at operation 345 in the process 300, the first and second substrates are bonded together via the first and second connecting structures. For example, as illustrated in FIG. 4E, the second substrate 420 is flipped upside down and attached to the first substrate 410 via the conductive bumps 418, 419. The first substrate 410 is referred to as "bottom die" and the second substrate 420 is referred to as "top die." In at least one embodiment, the bonding operation includes a flux application, chip placement, reflowing of melting solder joints, and/or cleaning of flux residue. As illustrated in FIG. 4E, a resulting structure 400E is obtained, and includes solder joints 438 formed by the corresponding conductive bumps 418, 428 joined together. An underfill material 440 is dispensed over the bottom die 410 to encapsulate the top die 420. The underfill material 440 fills in the space between the bottom die 410 and the top die 420, and reinforces the mechanical strength of the bonding between the bottom die 410 and the top die 420. Example materials of the underfill material 440 include, but are not limited to, a polymer and other suitable non-conductive materials.

Figure 4F:
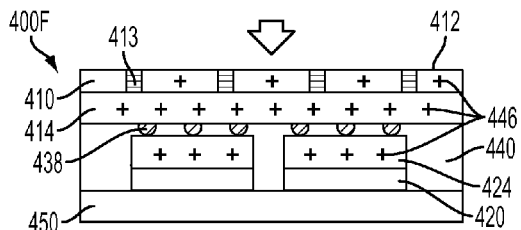

As illustrated in FIG. 3, at operation 365 in the process 300, a third connecting structure is formed over a second side of the first substrate, and electrostatic charges are discharged from the first and second substrates via a conductive layer of the third connecting structure. For example, as illustrated in FIG. 4F, a carrier 450 is bonded to the underfill material 440, and the resulting structure is flipped upside down, such that the second side 412 of the bottom die 410 faces upward. In at least one embodiment, the carrier 450 is a temporary substrate for use in the manufacturing process and to be removed upon completion of the final product. In some embodiments, the carrier 450 includes a silicon (Si) substrate, a glass substrate, or a ceramic substrate. The carrier 450 is temporarily bonded to the underfill material 440 by a releasable adhesive. In at least one embodiment, the carrier 450 is a substrate included in the final product.

The second side 412 of the bottom die 410 (now on top of the top die 420) is thinned in a back-side process. For example, a chemical mechanical polishing/planarization (CMP) process is performed on the second side 412 of the bottom die 410 until the TSVs 413 are exposed. During one or more of the bonding operation between the bottom die 410 and top die 420, the encapsulation operation using the underfill material 440, the bonding operation between the carrier 450 and the underfill material 440, and the thinning operation on the second side 412 of the bottom die 410, electrostatic charges 446 are accumulated in the bottom die 410 and the top die 420, as illustrated in the structure 400F in FIG. 4F.

Figure 4G:
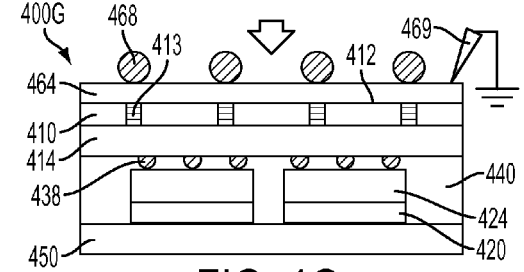

In at least one embodiment, the formation of the third connecting structure and the discharging operation via the third connecting structure are similar to the formation of the first connecting structure and the discharging operation via the first connecting structure. For example, as illustrated in FIG. 4G, the third connecting structure includes a conductive layer 464 corresponding to the conductive layers 414, and one or more conductive bumps 468 corresponding to the conductive bumps 418. A grounded electrode 469 is temporarily brought into contact with a conductive layer 464 to discharge electrostatic charges 446 from the bottom die 410 and top die 420 before the conductive layer 464 is partially removed. A resulting structure 400G is obtained as illustrated in FIG. 4G. In one or more embodiments, the discharging operation via the third connecting structure is omitted.

The process described with respect to FIGS. 3 and 4A-4G is a chip-on-wafer-on-substrate process in which the top die 420, that is an individual chip, is bonded to the bottom die 410, that is a wafer, and then the bottom die 410 and top die 420 are bonded to substrate 450. The techniques described herein are also applicable to other structures, such as chip-on-chip-on-chip, chip-on-substrate, wafer-on-wafer-on-substrate etc. in various embodiments.

As discussed herein, it is potentially difficult for electrostatic charges to be discharged from an interposer, such as the bottom die 410, due to the insulating nature of the interposer. By providing a ground path for the electrostatic charges 416 to be discharged from the interposer via the conductive layer 414 in accordance with some embodiments, the likelihood of undesirable and/or uncontrolled electrostatic discharge from the interposer to a chip, e.g., the top die 420, is significantly reduced during the front-side process and the bonding operation between the bottom die 410 and the top die 420. As a result, reliable ESD protection is provided for the chip in the top die 420. Further, the insulating nature of the carrier 450 and/or the underfill material 440 is likely to cause electrostatic charges 446 to be trapped in the top die 420, as best seen in FIG. 4F. By providing a ground path for the electrostatic charges 446 to be discharged from the top die 420, via the solder joints 438, the conductive layer 414, the TSVs 413 and the conductive layer 464, as best seen in FIG. 4F, the likelihood of undesirable and/or uncontrolled electrostatic discharge is also reduced during the back-side process.

Figure 5:
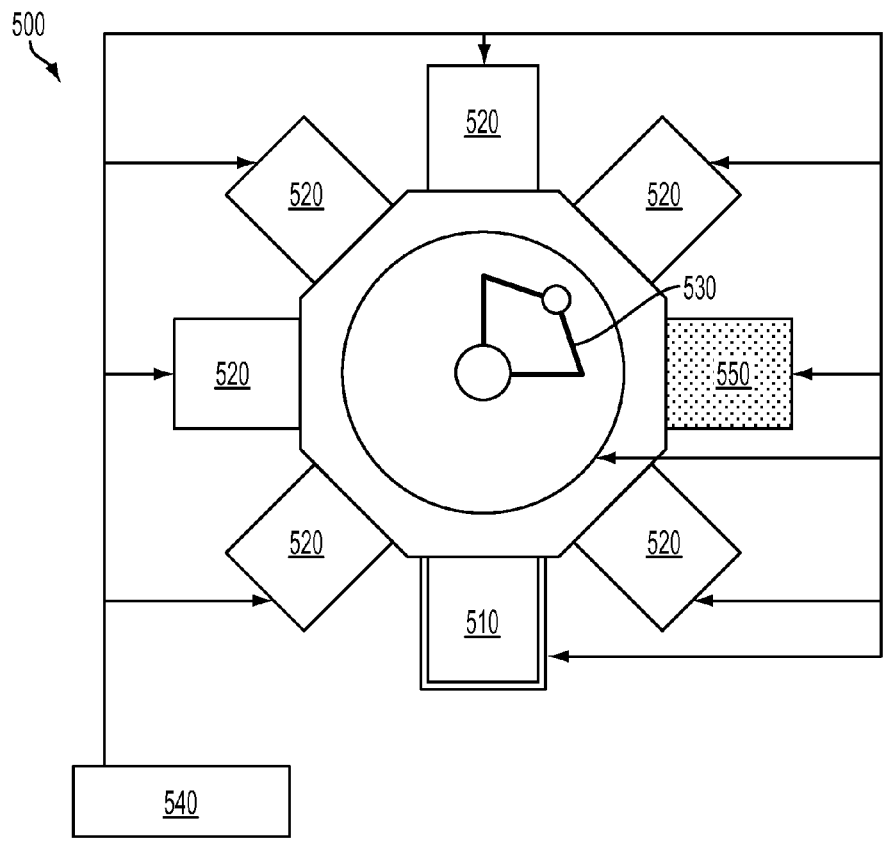
FIG. 5 is a schematic view of a wafer processing apparatus in accordance with some embodiments.

FIG. 5 is a schematic view of a wafer processing apparatus 500 in accordance with some embodiments. The wafer processing apparatus 500 includes a load lock chamber 510, a plurality of process chambers 520, a robot 530, a controller 540, and an ESD chamber 550. The load lock chamber 510 transfers wafers into and out of the wafer processing apparatus 500, e.g., under a vacuum environment. The robot 530 transfers the wafers among the load lock chamber 510, the process chambers 520, and the ESD chamber 550. The process chambers 520 are equipped to perform one or more of numerous processes or treatments, such as Chemical Vapor Deposition (CVD), Atomic Layer Deposition (ALD), Physical Vapor Deposition (PVD), annealing, etching, degassing, pre-cleaning, cleaning, post-cleaning, etc. The ESD chamber 550 is configured to discharge electrostatic charges from the wafers as described herein. The controller 540 is configured to control wafer transfer, processing and ESD protection. In one or more embodiments, the controller 540 comprises a hardware platform, such as a processor or controller chip coupled with a memory, which is programmable by software and/or firmware to perform the functions described herein. In some embodiments, the controller 540 comprises a dedicated hardware circuit, e.g., in the form of an application-specific integrated circuit (ASIC) hardwired to perform one or more of the processes described herein. While six process chambers 520 and one ESD chamber 550 are shown, other numbers of process chambers 520 and/or ESD chamber 550 are within the scope of various embodiments. Likewise, in some embodiments, more than one robot 530 and/or load lock chamber 510 are included in the processing apparatus 500.

In some embodiments, a wafer is transferred, by the robot 530 and under control of the controller 540, to one of the process chambers 520, and a conductive layer is formed over the wafer, for example, as described herein with respect to FIGS. 1, 2B(1) and 2B(2). The wafer with the conductive layer formed thereover is transferred, by the robot 530 and under control of the controller 540, to the ESD chamber 550, where electrostatic charges are discharged from the wafer via the conductive layer, for example, as described herein with respect to FIGS. 1, 2C(1) and 2C(2). In one or more embodiments, at least one conductive bump is formed over the conductive layer before discharging the electrostatic charges, for example, as described herein with respect to FIGS. 2C(1) and 2C(2). After discharging the electrostatic charges, the wafer is transferred, by the robot 530 and under control of the controller 540, from the ESD chamber 550 to one of the process chambers 520 where the conductive layer is partially removed, for example, as described herein with respect to FIGS. 1, 2D(1) and 2D(2).

In some embodiments, the ESD chamber 550 is integrated in one or more of the process chambers 520. For example, a grounded electrode as described herein is provided in a process chamber 520 to discharge electrostatic charges from the wafer being processed in the process chamber 520.

In some embodiments, the ESD chamber 550 is omitted from the wafer processing apparatus 500, and is provided as a stand-alone apparatus that has its own auto loading unit. Wafers are transferred between the wafer processing apparatus 500 and such a stand-alone ESD chamber by way of wafer transferring pods, e.g., Front Opening Universal Pods (FOUPs). For example, after a conductive layer is formed over every wafer in a wafer batch by the wafer processing apparatus 500, the wafer batch is transferred via the load lock chamber 510 to a FOUP, which is moved to the stand-alone ESD chamber. The wafers in the FOUP are loaded by the auto loading unit into the stand-alone ESD chamber where electrostatic charges are discharged from the wafers. After discharging the electrostatic charges, the wafers are returned to the wafer processing apparatus 500, by way of the same or another FOUP, for further processing, e.g., for partially removing the conductive layer as described herein.

In some embodiments, the ESD chamber 550 is implemented in a circuit probing tool. Examples of a circuit probing tool include, but are not limited to, the Circuit Probe (CP) tool and the Wafer Acceptor Test (WAT) tool. Such a circuit probing tool is configured to individually test an IC on a wafer for functional defects. In one or more embodiments, by modifying a program of the circuit probing tool and/or by manually controlling the circuit probing tool, it is possible to ground one or more probe pins of the circuit probing tool and cause the one or more grounded probe pins to temporarily contact a conductive layer on a wafer for discharging electrostatic charges from the wafer as described herein. In at least one embodiment, the wafer transfer between the wafer processing apparatus 500 and a circuit probing tool configured to function as an ESD chamber is similar to the wafer transfer between the wafer processing apparatus 500 and a stand-alone ESD chamber.

Figure 6:
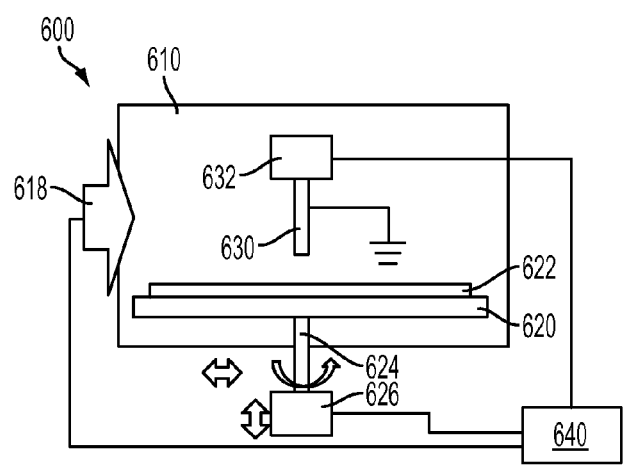
FIG. 6 is a schematic cross-section view of an ESD chamber in accordance with some embodiments.

FIG. 6 is a schematic cross-section view of an ESD chamber 600 in accordance with some embodiments. The ESD chamber 600 is implemented as the ESD chamber 550 in the wafer processing apparatus 500, as a stand-alone ESD chamber, or in a circuit probing tool as described herein. The ESD chamber 600 includes a housing 610, a chuck 620 and an electrode 630 disposed in the housing 610, and a controller 640. The housing 610 has an inlet 618 for loading and unloading wafers into and from the housing 610. For example, the inlet 618 is an auto loading unit.

The chuck 620 is configured to support thereon a wafer 622 from which electrostatic charges are to be discharged. In some embodiments, the chuck 620 is a vacuum chuck that generates vacuum pressures through a number of vacuum ports in the chuck 620 to hold the wafer 622 on the chuck 620. In some embodiments, the chuck 620 is a mechanical chuck that uses mechanical clamps to secure the wafer 622 thereon. Other wafer holding arrangements are usable in further embodiments. The chuck 620 is supported on a shaft 624 which is driven by a chuck moving mechanism 626, e.g., one or more motor. The chuck moving mechanism 626 is configured to move the chuck 620 in one or more directions as indicated by the arrows in FIG. 6. For example, the chuck 620 is moveable in a normal direction of the chuck 620 toward and away from the electrode 630, and/or is translatable in at least one direction in a plane of the chuck 620, and/or is rotatable about an axis of the shaft 624. The chuck moving mechanism 626 is coupled to the controller 640.

The electrode 630 is a grounded electrode. In some embodiments, the electrode 630 is a stationary electrode, and a relative movement between the chuck 620 and the electrode 630 is effected by the chuck moving mechanism 626. In at least one embodiment, a relative movement between the chuck 620 and the electrode 630 is implemented by moving the electrode 630 in lieu of or in addition to a movement of the chuck 620. For example, an electrode moving mechanism 632 is provided to effect a movement of the electrode 630 in one or more directions similar to those described with respect to the chuck moving mechanism 626.

The controller 640 is coupled to the inlet 618 to control the loading and unloading of wafers to and from the housing 610. The controller 640 is further coupled to the chuck moving mechanism 626 and the electrode moving mechanism 632 to control a relative movement between the chuck 620 and the electrode 630. In at least one embodiment, the controller 640 is provided individually to the ESD chamber 600, for example, when the ESD chamber 600 is a stand-alone ESD chamber. In some embodiments, the controller 640 is incorporated, partly or wholly, in another controller, for example, the controller 540 of the wafer processing apparatus 500 or a controller of a circuit probing tool.

In operation, the wafer 622 is loaded onto the chuck 620 and held thereon. A relative movement between the chuck 620 and the electrode 630 is controlled by the controller 640 to cause the electrode 630 to temporarily contact a conductive layer on the wafer 622 to discharge electrostatic charges from the wafer 622. In at least one embodiment, the ESD chamber 600 further includes an optical alignment system for aligning an intended contact region, e.g., a scribe line, on the wafer 622 with the tip of the electrode 630. After discharging electrostatic charges from the wafer 622, the wafer 622 is released and unloaded from the chuck 620. Another wafer is loaded onto the chuck 620 under control of the controller 640, and the process repeats.

The method(s) described herein include(s) example operations, but the operations are not necessarily performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In a process according to some embodiments, at least one circuit element is formed in a substrate. A conductive layer is formed over the substrate and in electrical contact with the at least one circuit element. Electrostatic charges are discharged from the substrate via the conductive layer.

In a process according to some embodiments, a first connecting structure is formed over a first side of a first substrate, the first substrate having a second side opposite the first side. A second connecting structure is formed over a second substrate. The first substrate is bonded to the second substrate via the first connecting structure and the second connecting structure. A third connecting structure is formed over the second side of the first substrate. Electrostatic charges are discharged from at least one of the first substrate or the second substrate via at least one conductive layer of at least one of the first connecting structure, the second connecting structure or the third connecting structure.

A wafer processing apparatus in accordance with some embodiments comprises an electrostatic discharge (ESD) chamber, a wafer support in the ESD chamber, a grounded electrode in the ESD chamber, and a controller. The wafer support is configured to support thereon a wafer having a conductive layer. The controller is configured to cause the grounded electrode to temporarily contact the conductive layer to discharge electrostatic charges from the wafer.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method forming a semiconductor device, comprising:
 forming at least one circuit element in each die of a plurality of dies of a substrate, where an outer region of the substrate surrounds each die of the plurality of dies;
 forming a conductive layer over the substrate, wherein the conductive layer is over and vertically aligned with at least one die of the plurality of dies and over and vertically aligned with a portion of the outer region, the conductive layer in electrical contact with the at least one circuit element in the at least one die;
discharging electrostatic charges from the substrate via the conductive layer, wherein the discharging includes directly contacting a grounded electrode to a top surface of the conductive layer; and
after the discharging electrostatic charges removing a portion of the conductive layer.

2. The method of claim 1, wherein
discharging the electrostatic charges comprises causing the grounded electrode to temporarily contact the conductive layer over the outer region.

3. The method of claim 2, wherein
the outer region comprises at least one scribe line,
said discharging the electrostatic charges comprises causing the grounded electrode to temporarily contact the conductive layer over the at least one scribe line.

4. The method of claim 1, wherein the plurality of dies includes at least one interposer.

5. The method of claim 1, further comprising:
forming a conductive bump over the substrate prior to the discharging electrostatic charges.

6. The method of claim 1, wherein the conductive layer includes an under-bump metal (UBM) structure.

7. The method of claim 1, wherein the removing the portion of the conductive layer includes performing photolithographic masking and etching operations.

8. The method of claim 1, wherein the removing the portion of the conductive layer includes maintaining another portion of the conductive layer in one shape of a circular shape, an octagonal shape, a square shape, or a rectangular shape.

9. A process, comprising:
forming a first conductive structure over a first side of a first substrate, the first substrate having a second side opposite the first side;
forming a second conductive structure over a second substrate;
contacting a conductive layer of the first conductive structure with a grounded electrode;
after the contacting, bonding the first substrate to the second substrate to form a bonded substrate assembly;
forming a third conductive structure over the second side of the first substrate after the bonding; and
after forming the bonding and the forming the third connecting structure, contacting the third conductive structure with the grounded electrode.

10. The process of claim 9, wherein the contacting the conductive layer discharges electrostatic charge.

11. The process of claim 9, wherein the conductive layer of the first conductive structure comprises a metal layer of an under-bump metallization structure.

12. The process of claim 9, further comprising:
partially removing the conductive layer,
wherein the contacting the conductive layer causes the grounded electrode to temporarily contact the conductive layer of the first connecting structure before said partially removing the conductive layer.

13. The process of claim 12, further comprising:
forming at least one conductive bump over the conductive layer before the contacting the conductive layer of the first connecting structure,
wherein said partially removing the conductive layer comprises etching the conductive layer, using the conductive bump as an etch mask.

14. The process of claim 9, wherein
the conductive layer is formed over at least one scribe line of the first substrate, and
wherein the contacting the conductive layer includes temporarily contacting the conductive layer of the first connecting structure over the at least one scribe line.

15. The process of claim 9 further comprising:
contacting a conductive layer of the second conductive structure with a grounded electrode prior to the bonding.

16. The process of claim 9, wherein
the second substrate comprises at least one integrated circuit and a second conductive layer formed over the second substrate and in electrical contact with the at least one integrated circuit, and wherein the process further comprises:
contacting the grounded electrode to the second conductive layer before said bonding the first substrate to the second substrate.

17. A process, comprising:
bonding a first substrate to a second substrate via to form a three-dimensional integrated circuit (3DIC);
forming a conductive structure over an outer layer of the 3DIC; and
discharging electrostatic charges from the first substrate and the second substrate via the conductive structure, wherein the conductive structure includes a metal layer and at least one solder bump over the outer layer of the 3DIC, wherein the discharging includes temporarily bringing a grounded electrode into contact with a surface of the conductive structure.

18. The process of claim 17, wherein forming the conductive structure comprises forming a metal layer over a surface of the first substrate.

19. The process of claim 18, wherein the discharging includes temporarily bringing the grounded electrode into contact with a surface of the metal layer.

20. The process of claim 17, further comprising:
performing a first electrostatic discharge process on the first substrate prior to the bonding; and
performing a second electrostatic discharge process on the second substrate prior to the bonding, wherein the first and second electrostatic discharge processes include temporarily bringing the grounded electrode into contact with the first and second substrate respectively.

* * * * *